United States Patent
Wig

(10) Patent No.: US 9,599,661 B2
(45) Date of Patent: Mar. 21, 2017

(54) TESTING DEVICE FOR VALIDATING STACKED SEMICONDUCTOR DEVICES

(71) Applicant: Intel Corporation, Santa Clara, CA (US)

(72) Inventor: Timothy D. Wig, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 686 days.

(21) Appl. No.: 13/629,273

(22) Filed: Sep. 27, 2012

(65) Prior Publication Data

US 2014/0084954 A1 Mar. 27, 2014

(51) Int. Cl.
G01R 31/00 (2006.01)
G01R 31/28 (2006.01)

(52) U.S. Cl.
CPC ...... *G01R 31/2863* (2013.01); *G01R 31/2889* (2013.01)

(58) Field of Classification Search
CPC .. G01R 1/0483; G01R 1/0408; G01R 1/0416; G01R 1/0433; G01R 31/2886; G01R 31/2808; G01R 31/26; G01R 31/2884; G01R 1/045; G01R 1/0491; G01R 31/31717; G01R 31/04; G01R 31/2801; G01R 31/2851

See application file for complete search history.

(56) References Cited

U.S. PATENT DOCUMENTS

| 4,866,508 A | 9/1989 | Eichelberger et al. |
| 4,924,589 A | 5/1990 | Leedy |
| 6,087,845 A | 7/2000 | Wood et al. |

(Continued)

FOREIGN PATENT DOCUMENTS

| JP | 10-150083 A | 6/1998 |
| KR | 10-0390093 B1 | 7/2003 |

(Continued)

OTHER PUBLICATIONS

PCT/US2013/045035 International Search Report, mailed Nov. 26, 2013, 8 pages.

(Continued)

*Primary Examiner* — Tung X Nguyen
(74) *Attorney, Agent, or Firm* — Blakely, Sokoloff, Taylor & Zafman LLP

(57) ABSTRACT

Embodiments of the invention describe apparatuses, systems and method for utilizing testing instruments having electrical interconnects formed from High Density Interconnect (HDI) multi-layer substrates. Electrical signals may be routed between devices mounted on HDI substrates by way of conductive interconnects formed within their multiple layers. The conductive interconnects are generally comprised of metal interconnects and vias, where each via penetrates between layers to couple a metal interconnect from one layer to a metal interconnect from another layer. By utilizing HDI substrates, embodiments of the invention enable "breaking out" the signal pins on multiple layers, perhaps double or triple the routing layers of the package channel; however, the geometry of the transmission lines and other factors may be chosen to ensure channel parameters such as impedance and crosstalk closely emulate the final device package.

8 Claims, 5 Drawing Sheets

(56) References Cited

U.S. PATENT DOCUMENTS

| | | | |
|---|---|---|---|
| 6,462,570 B1* | 10/2002 | Price et al. | 324/756.02 |
| 7,119,563 B2* | 10/2006 | Casey | G01R 31/2889 |
| | | | 324/756.05 |
| 7,342,969 B2 | 3/2008 | Tate et al. | |
| 7,501,586 B2 | 3/2009 | Wig et al. | |
| 7,605,671 B2 | 10/2009 | Liang et al. | |
| 2004/0017216 A1* | 1/2004 | Mardi et al. | 324/755 |
| 2004/0174180 A1* | 9/2004 | Fukushima | G01R 31/2889 |
| | | | 324/756.05 |
| 2008/0093726 A1* | 4/2008 | Preda | H01L 23/50 |
| | | | 257/700 |
| 2013/0313709 A1 | 11/2013 | Hinck et al. | |

FOREIGN PATENT DOCUMENTS

| | | |
|---|---|---|
| KR | 10-2007-0093450 A | 9/2007 |
| KR | 10-2011-0081378 A | 7/2011 |
| KR | 10-2012-0024099 A | 3/2012 |

OTHER PUBLICATIONS

PCT/2013/045035 Written Opinion of the International Searching Authority mailed Nov. 26, 2013, 4 pages.

\* cited by examiner

TESTING DEVICE FOR VALIDATING STACKED SEMICONDUCTOR DEVICES

FIELD

Embodiments of the invention generally pertain computing devices and more particularly to validating stacked semiconductor devices.

BACKGROUND

When validating semiconductor devices, it is ideal to test the device (i.e., the Device Under Test (DUT)) in conditions that closely resemble their target application. Some devices, such as memory modules, have a "stacked" design that utilizes short, fast data transmission channels that are not possible to emulate in current testing environments. What is needed is a testing solution that can emulate the channel performance of such a device when it is included and utilized in its assembled package. These testing devices would better validate and qualify components prior to their assembly, and allow for more realistic performance tests to be executed on the DUT.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DESCRIPTION

Embodiments of the invention describe apparatuses, systems and methods for utilizing testing instruments having electrical interconnects formed from High Density Interconnect (HDI) substrates. HDI technology generally spans the technology gap between conventional Printed Circuit Board (PCB) technology and package substrate technology. HDI substrates are multi-layer substrates used to mount and interconnect integrated circuit devices. Electrical signals may be routed between devices mounted on HDI substrates by way of conductive interconnects formed within the substrates' multiple layers. The conductive interconnects are generally comprised of metal interconnects and vias, where each via penetrates between layers to couple a metal interconnect from one layer to a metal interconnect from another layer.

By utilizing HDI substrates as described below, embodiments of the invention enable "breaking out" the signal pins on multiple layers, perhaps double or triple the routing layers of the package channel; however, the geometry of the transmission lines and other factors may be chosen to ensure channel parameters such as impedance and crosstalk closely emulate the final device package.

In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1:
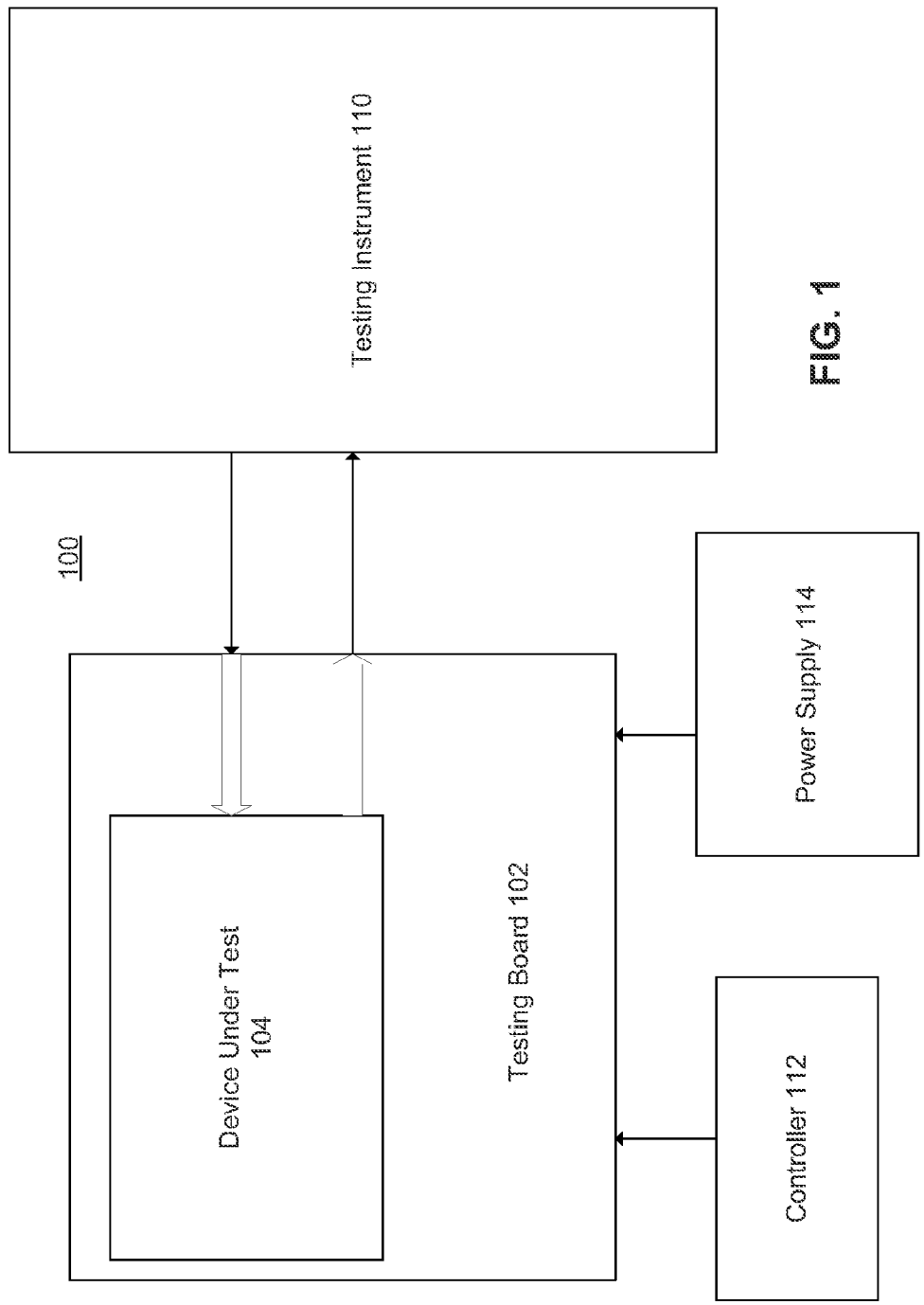
FIG. 1 is a block diagram of a device testing system environment according to an embodiment of the invention.

FIG. 1 is a block diagram of a device testing system environment according to an embodiment of the invention. In this embodiment, system 100 includes testing board 102, used to communicatively couple device under test (DUT) 104 to device controller 112, power supply 114 and testing instrument 110.

When testing devices such as memory modules, it is desirable to create a test fixture that allows testing instrument 110 to directly interface with the input/output (I/O) of the device. Said testing platforms that enable this testing may be referred to as Bench Electrical Validation Boards. These testing boards are designed to minimize channel impairments such as impedance mismatch, dielectric and copper loss, parasitic inductance/capacitance, and crosstalk, to provide the most direct electrical access between instrumentation and the semiconductor. Prior art solutions for these testing boards do not serve as an effective predictor of system performance when testing multi-chip package (MCP) devices, such as device 275 of FIG. 2 as described below.

Embodiments of the invention utilize HDI technology in testing board 102 to mimic the target CPU or host package for DUT 104 such that bench validation can emulate the channel performance of the assembled package. This HDI "compliance board" allows for testers to better validate and qualify components prior to assembly, and allow more realistic performance margining tests on the bench.

Figure 2:
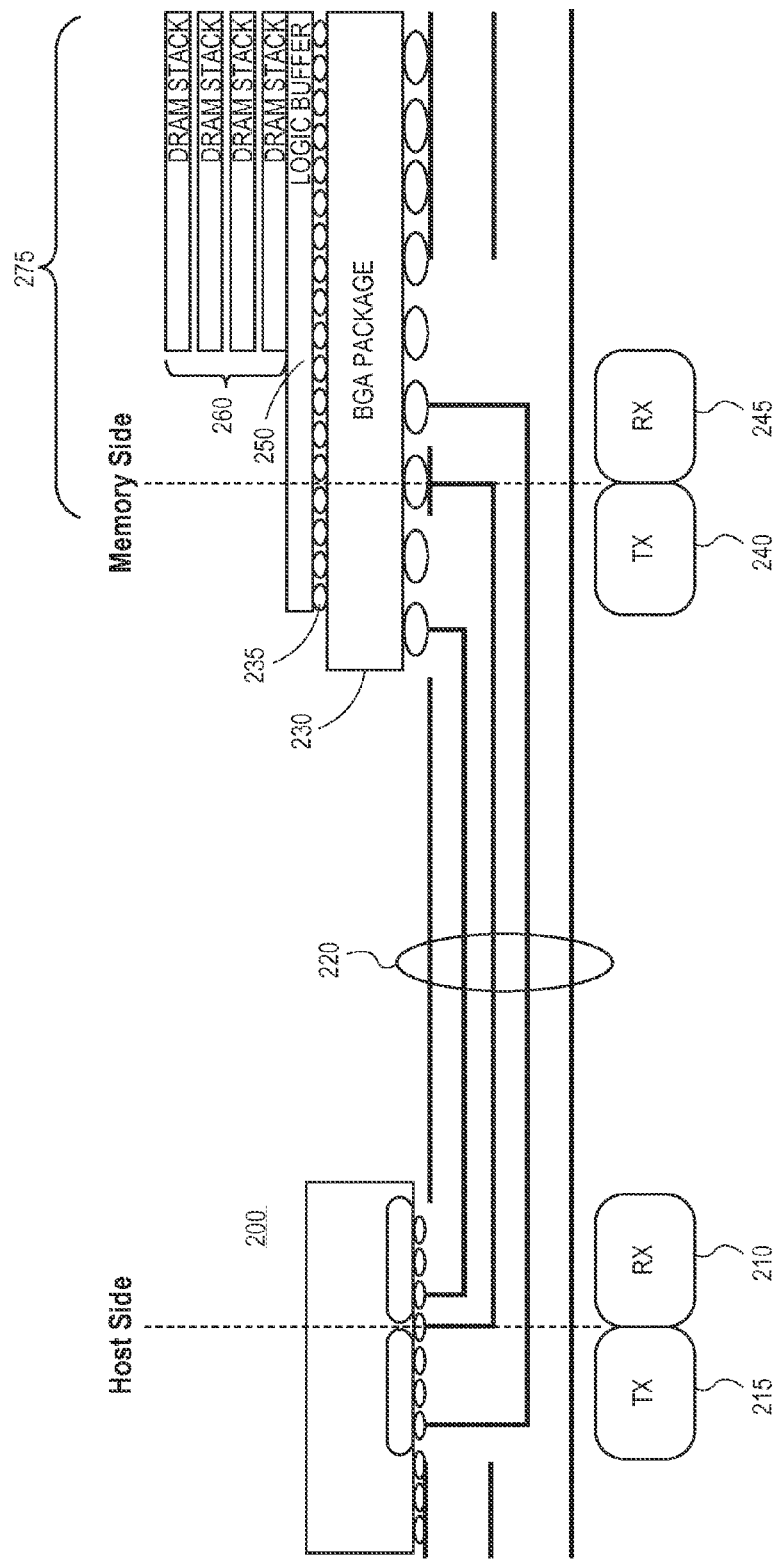
FIG. 2 is a block diagram of a multi-chip packaged device to be validated by testing devices according to embodiments of the invention.

FIG. 2 is a block diagram of a multi-chip packaged device to be validated by testing devices according to embodiments of the invention. FIG. 2 illustrates a host (e.g., a processor) in one package coupled with a device (e.g., one or more memory components) that is housed in a separate package.

The testing environment of FIG. 1 may be utilized to simulate this environment (i.e., simulate the communication channel between the DUT and the host) in order to test the performance and functionality of said device. The example of FIG. 2 includes a stacked Dynamic Random Access Memory (DRAM) device; however, other types of stacked devices can also be tested by embodiments of the invention.

In the example of FIG. 2, host 200 and device 275 are illustrated to be packaged separately for exemplary and illustrative purposes only. The packages may be, for example, ball grid array (BGA) packages or wafer-level packages that may be assembled on or within another package. Due to the additional packaging, these devices may suffer from increased crosstalk. In other embodiments, device 275 may be directly mounted on an MCP substrate that also mounts its mating CPU or host device. In these embodiments, device 275 is designed for a very short channel operating a high speeds (e.g., at 8 GT/s single-ended without equalization).

In one embodiment, the interface between host 200 and device 275 includes a tunable source-terminated receiver, data bus inversion (DBI) encoding of data/commands, a sense amplifier receiver, and/or a differential forwarded clock (to overcome clock noise and receiver training) Host 200 is shown to include transmitter 215 and receiver 210 that are coupled with device 275 through a package interface (e.g., BGA) and lines 220. Device package 230 includes counterpart receiver 245 and transmitter 240 coupled with lines 220.

In one embodiment, transmitter 240 and receiver 245 are coupled with lines 220 through package interface 235. Package interface 235 provides an interface between package 230 and logic buffer 250. Thus, this additional packing and interface needs to be simulated in a testing environment. As described below, embodiments of the invention utilize HDI substrate for this purpose.

In similar high-speed applications (e.g., Quick Path Interconnect (QPI), Peripheral Component Interconnect express (PCIe)), it is understood that simulation alone may not be a sufficient predictor of link performance, even when the passive channel is well-modeled. This is largely due to imprecise prediction of the silicon behavior, whose performance parameters are typically refined after first silicon.

By utilizing HDI substrates, embodiments of the invention allow for the possibility of constructing a passive "compliance channel" in an HDI based fixture that replicates the channel of the target host device for the DUT (i.e., the MCP).

Figure 3A:
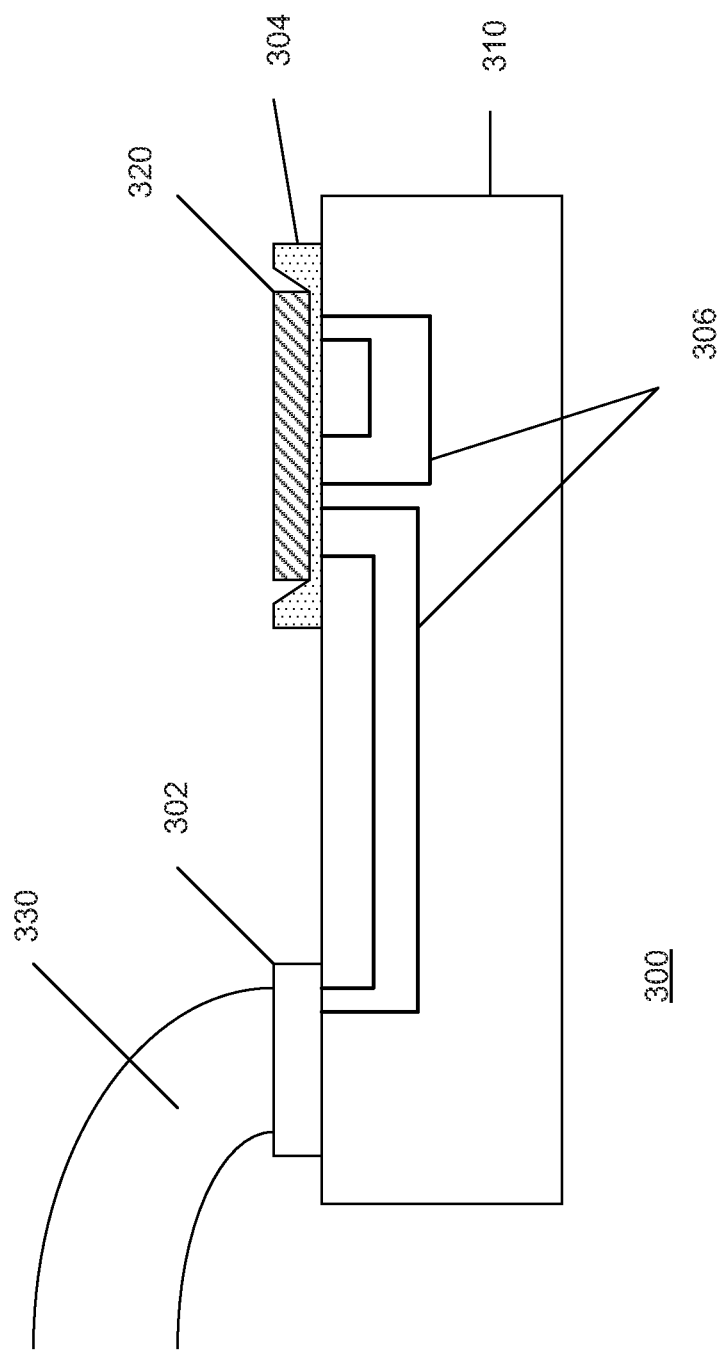
FIG. 3A-FIG. 3B are illustrations of a testing board formed from HDI substrate according to an embodiment of the invention.
Figure 3B:
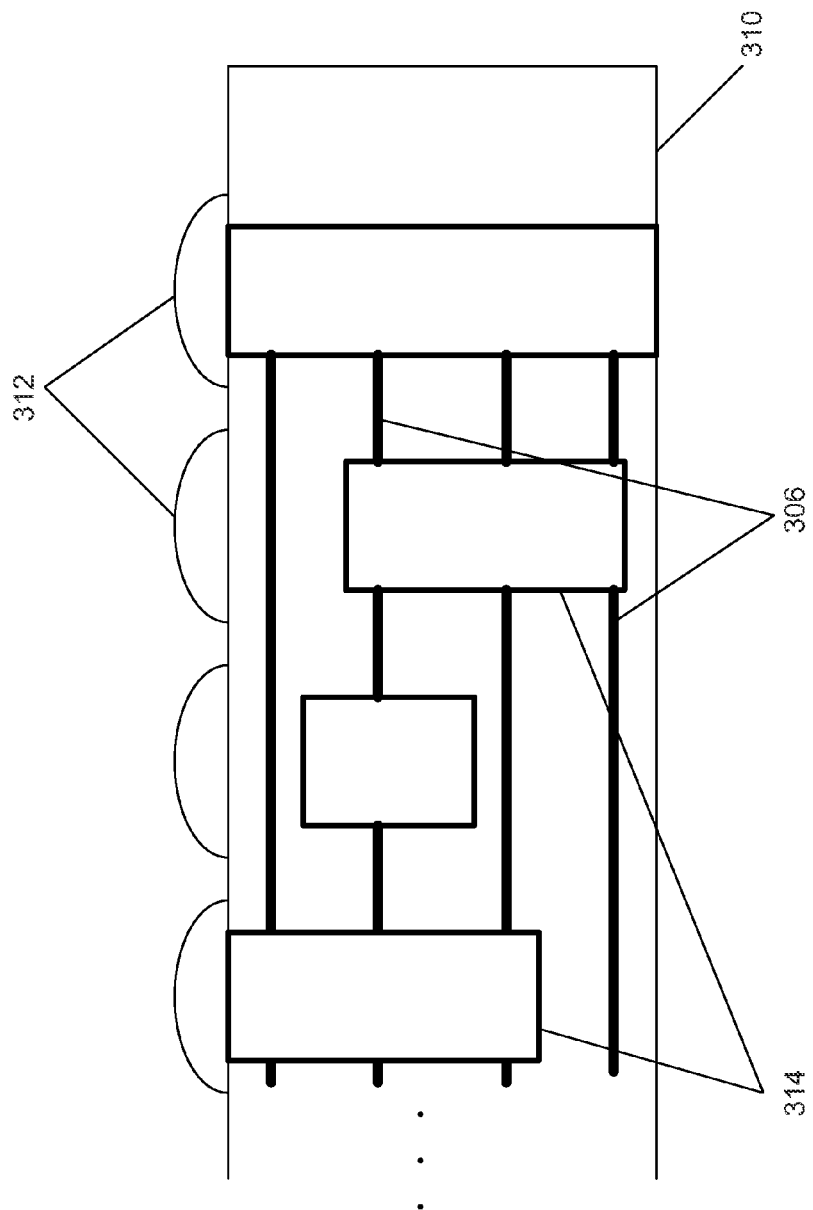

FIG. 3A-FIG. 3B are illustrations of a testing board formed from HDI substrate according to an embodiment of the invention. Testing environment 300 is shown to include DUT port 304 (for receiving DUT 320) and testing instrument port 302 (for receiving testing instrument interface 330) communicatively coupled via testing board 310. In this embodiment, testing board 310 includes electrical interconnects 306 formed from HDI substrate.

While a traditional test fixture that has minimal electrical channel would be useful impairments (such a validation board), embodiments of the invention can further emulate the in-system characteristics of the target application (e.g., as discussed above with respect to FIG. 2). Thus, embodiments of the invention utilize HDI substrate such that, by designing interconnects 306 to emulate the electrical characteristics of the target system, in-system performance is better predicted, reducing the risk of performance issues for the final target package of DUT 320.

FIG. 3B illustrates an example interconnection design for interconnects 306 of testing board 310. The HDI substrate of testing board 310 includes multiple layers of electrical interconnects, shown as interconnects 306. The multiple layers may include conventional layers used in HDI substrates, including but not limited to core layers, prepreg layers, and dielectric layers. Said multiple layers may be formed using insulating materials such as conventional dielectric materials, resins, glass reinforced epoxies, and non-reinforced epoxies.

Metal interconnects 306 may be formed using a variety of metals, including but not limited to copper (e.g., copper foil or copper foil plated with copper metal) or aluminum. In some embodiments, the diameter or thickness of metal interconnects 306 is relatively small, and may be referred to as metal traces.

The HDI substrate of testing board 310 includes a plurality of vias 314 that are used to electrically couple interconnects 306 formed from the multiple layers of the HDI substrate. In some embodiments, vias 314 may each comprise micro-vias. Vias 314 may be formed, for example, from a metal such as copper or tungsten. Alternate metals well known in the art for vias may be used as well. Furthermore, vias 314 may comprise hollow vias, filled vias (e.g., filled with copper, epoxy resin, etc.), or a combination of both.

As shown in FIG. 3A, a combination of metal interconnects 306 and vias 310 may be used to electrically couple BGA assembly 312 of a device interconnect (or the device itself) to either a testing instrument or a controlling instrument, thereby enabling the two devices to communicate using electrical signals that are routed internally within the HDI substrate of testing board 310.

As described above, when a device such as stacked DRAM memory module 275 is directly mounted on an MCP substrate that also mounts its mating CPU or host device, it is difficult for prior art testing devices to simulate and verify the I/O performance between the two devices. This is because the two devices may be rigidly attached to the package substrate by means of solder reflow and adhesive epoxy underfill, and no direct observability is possible.

By utilizing HDI substrates as described above, embodiments of the invention enable "breaking out" the signal pins on multiple layers, perhaps double or triple the routing layers of the package channel; however, the geometry of the transmission lines and other factors may be chosen to ensure channel parameters such as impedance and crosstalk closely emulates the final device package.

Figure 4:
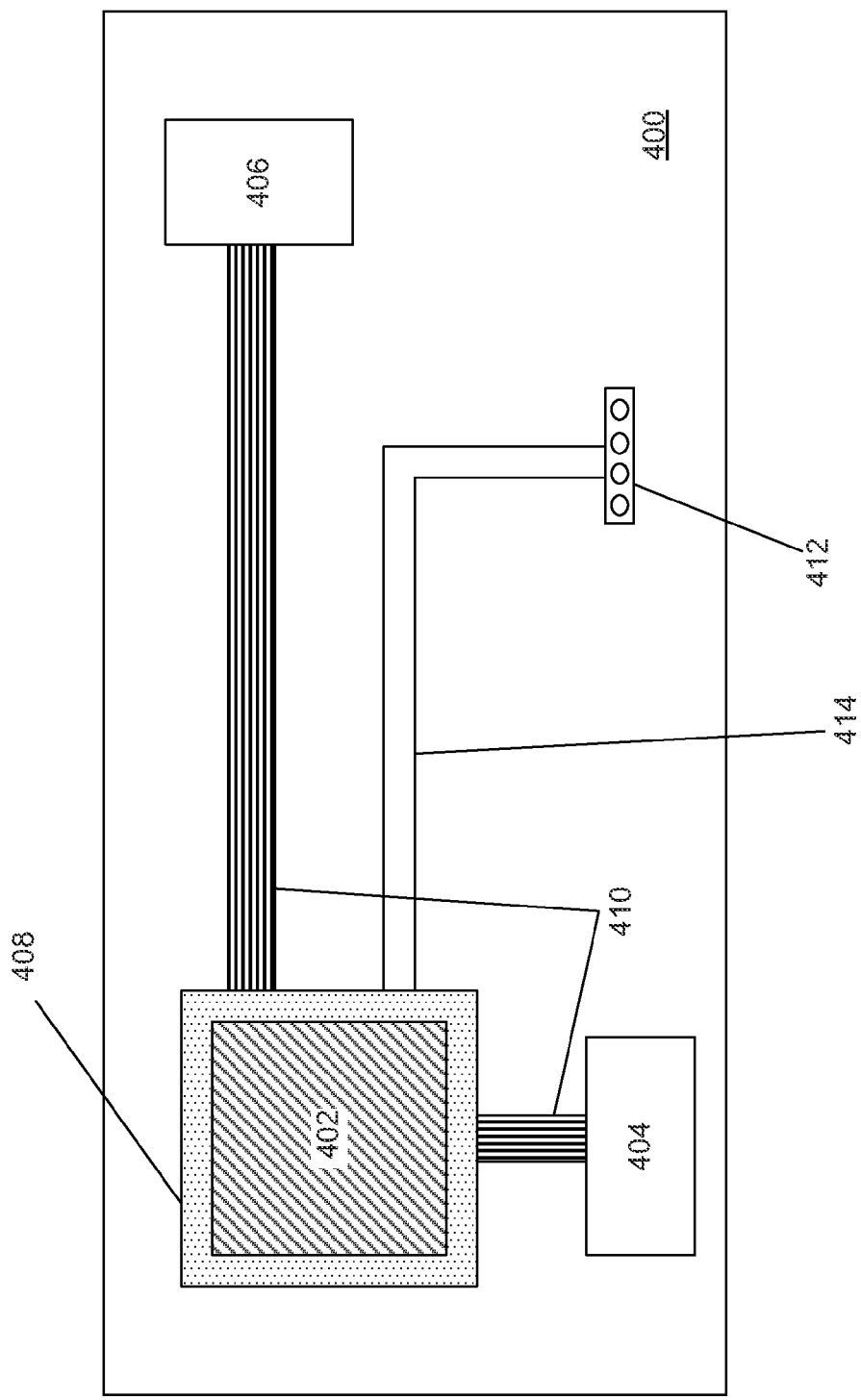
FIG. 4 is a block diagram of a testing board formed from HDI substrate and including a plurality of device sockets according to an embodiment of the invention.

FIG. 4 is a block diagram of a testing board formed from HDI substrate and including a plurality of device sockets according to an embodiment of the invention. Device testing board 400 includes device socket 402 for receiving semiconductor device 408, such as an MCP semiconductor device. In some embodiments, device socket 402 includes electrodes for receiving a BGA device interconnect; in other embodiments, device socket 402 includes electrodes for receiving a Pin Grid Array (PGA) device interconnect, or any other functionally equivalent device interconnect.

Board 400 is shown to further include test instrument socket 406 for a test instrument coupler (not shown), control socket 404 for receiving control signals for the semiconductor device, and power port 412 for receiving power from a power supply for powering the semiconductor device (via non-HDI electrical interconnecting means 414, such as on a layer with broader power planes). Other embodiments may include multiple test sockets and control sockets, or allowing multiple test instruments and controllers to be coupled to the DUT.

In this embodiment, board 400 includes electrical interconnects 410 formed from HDI substrate. Said electrical interconnects may include one or more vias (either filled, unfilled, or a combination of both). While in this embodiment, HDI electrical interconnects 410 are shown to communicatively couple control socket 404 and test instrument socket 406 to device 408, in other embodiments only said test instrument socket is coupled to the DUT via HDI electrical interconnects. HDI electrical interconnects 410 may be designed to emulate an expected host platform interconnect (e.g., a processor interconnect) for semiconductor device 408

In other words, said electrical interconnects may be designed to compensate for the effects of the socket and other fixed geometric constraints, to better match the channel performance of the MCP in its intended platform environment.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable non-transitory storage medium may also include a storage or database from which content can be downloaded. Said computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. An apparatus, comprising:
a device port to receive a semiconductor device;
a test instrument interface to receive a test instrument interconnect; and,
a testing board interconnecting the device port and the test instrument socket, the testing board formed from a High Density Interconnect (HDI) substrate, the High Density Interconnect substrate comprising multiple signal plane layers, the High Density Interconnect substrate comprising at least one signal wiring path connecting said device port and said test instrument socket having a micro-via that extends on one end from a signal wire along one of said plane layers through first and second ones of said signal plane layers to said device port, wherein said micro via does not extend completely through said HDI substrate, said device port located on an upper level of said testing board, said micro via residing beneath a region of said upper level where the semiconductor device is to be placed over the testing board by way of its connection to the device port, said micro-via not extending to said upper level.

2. The apparatus of claim 1, wherein the device port includes electrodes to receive a Ball Grid Array (BGA) device interconnect.

3. The apparatus device of claim 1, wherein the device port includes electrodes to receive a Pin Grid Array (PGA) device interconnect.

4. The apparatus of claim 1, wherein the device port is configured to receive a multi-chip package semiconductor device.

5. The apparatus of claim 1, wherein the at least one signal wiring path is designed to emulate an interconnect between a host and a memory package having stacked memories.

6. The apparatus of claim 1, further comprising: a plurality of test instrument sockets to receive a plurality of test instrument interfaces.

7. The apparatus of claim 1, further comprising: a power port to receive power from a power supply to power the semiconductor device.

8. The apparatus of claim 1, further comprising: a control socket to receive control signals for the semiconductor device.

* * * * *